US007973551B2

(12) United States Patent
Jiang

(10) Patent No.: US 7,973,551 B2
(45) Date of Patent: Jul. 5, 2011

(54) TEST FIXTURE FOR PRINTED CIRCUIT BOARD

(75) Inventor: Hongjun Jiang, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 4 days.

(21) Appl. No.: 12/576,656

(22) Filed: Oct. 9, 2009

(65) Prior Publication Data

US 2011/0084719 A1    Apr. 14, 2011

(51) Int. Cl.
    *G01R 31/28*      (2006.01)
(52) U.S. Cl. .................................. 324/763.01
(58) Field of Classification Search ............ 324/762.01–762.06, 763.01–763.02, 757.01–757.04, 754.01, 324/754.09; 257/48; 438/14–18
See application file for complete search history.

(56) References Cited

U.S. PATENT DOCUMENTS

| | | |
|---|---|---|
| 4,357,575 A | 11/1982 | Uren et al. |
| 5,056,765 A | 10/1991 | Brandstater |
| 5,572,144 A | 11/1996 | Davidson et al. |
| 5,831,160 A | 11/1998 | Steketee |
| 5,894,225 A | 4/1999 | Coffin |
| 6,084,422 A | 7/2000 | Bartholomew |
| 6,191,601 B1 | 2/2001 | Swart |
| 6,336,276 B1 | 1/2002 | Krajec et al. |
| 6,469,495 B1 | 10/2002 | Boswell et al. |
| 6,545,459 B2 | 4/2003 | Boswell et al. |
| 6,563,297 B1 | 5/2003 | Boswell et al. |

(Continued)

FOREIGN PATENT DOCUMENTS

EP         0475614 A2    3/1992

OTHER PUBLICATIONS

European Patent Office, Extended European Search Report for EP Application No. 09172726.3 dated Mar. 30, 2010, Germany.
European Patent Office, Extended European Search Report for EP Application No. 10150156.7 dated Jun. 16, 2010, Germany.
Rohde & Schwarz, "R & S TS7110 RF Test Fixture for Modules and Units with Radio Interface Reliable Test Results for Wireless Devices Under Test", Online Internet Article, Mar. 29, 2010, 3 pages.

(Continued)

*Primary Examiner* — Ha Tran T Nguyen
*Assistant Examiner* — Tung X Nguyen
(74) *Attorney, Agent, or Firm* — Ogilvy Renault LLP

(57) ABSTRACT

There is provided a printed circuit board ("PCB") test fixture comprising a support, an electrical tester, and a pusher. The support is for supporting a PCB being tested in a PCB test position. The electrical tester is positioned with respect to the PCB test position such that, when a PCB is supported by the support in the PCB test position, the electrical tester is disposed in electrical contact with a circuit on the PCB supported by the support in the PCB test position during PCB testing. The pusher is configured for releasable coupling to a plurality of pusher members, such that each one of the plurality of pusher members is configured to co-operate with the pusher so as to become releasably coupled to and uncoupled from the pusher independently of the releasable coupling and uncoupling of at least another one of the plurality of pusher members, and such that an operative plurality of pusher members is provided when each one of the plurality of pusher members is releasably coupled to the pusher, wherein the operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position.

23 Claims, 13 Drawing Sheets

U.S. PATENT DOCUMENTS

| | | | |
|---|---|---|---|
| 6,819,099 B1 | 11/2004 | Repko et al. | |
| 6,894,479 B2 * | 5/2005 | Siefers et al. | 324/754.16 |
| 6,900,648 B2 | 5/2005 | Ou et al. | |
| 6,917,212 B2 | 7/2005 | Zhao et al. | |
| 6,958,616 B1 * | 10/2005 | Mahoney et al. | 324/755.05 |
| 7,400,135 B1 | 7/2008 | Bartholomew et al. | |
| 2002/0074993 A1 | 6/2002 | Boswell et al. | |
| 2004/0075456 A1 | 4/2004 | Zhao et al. | |
| 2004/0226167 A1 | 11/2004 | Tseng et al. | |
| 2004/0257097 A1 | 12/2004 | Beaucag et al. | |

OTHER PUBLICATIONS

Smith, Michael J. and Adams, Neil, "The Selection and Economics of Wireless Test Fixtures", Online Internet Article, Sep. 2006, 6 pages.

Wikipedia, "In-circuit Test", Online Internet Article, Dec. 9, 2008.

Checksum Part Programming and Board Test, "In-Circuit Test Fixture Systems and Kits", Online Internet Article, Dec. 9, 2008.

Checksum Part Programming and Board Test, "Frequently Asked Questions about Test Fixtures", Online Internet Article, Dec. 9, 2008.

* cited by examiner

TEST FIXTURE FOR PRINTED CIRCUIT BOARD

TECHNICAL FIELD

Test fixtures are used for testing the electrical functionality of printed circuit board.

BACKGROUND OF THE ART

The testing of electronic components or devices during manufacturing involves use of a test fixture to accurately position the device under test so that electrical contacts are properly engaged to perform the test. Inaccurate placement or lack of appropriate electrical contact could result in a false rejection of the device under test and significant waste.

DESCRIPTION OF THE DRAWINGS

The embodiments will now be described with reference to the following drawings, in which.

DETAILED DESCRIPTION

Figure 1:
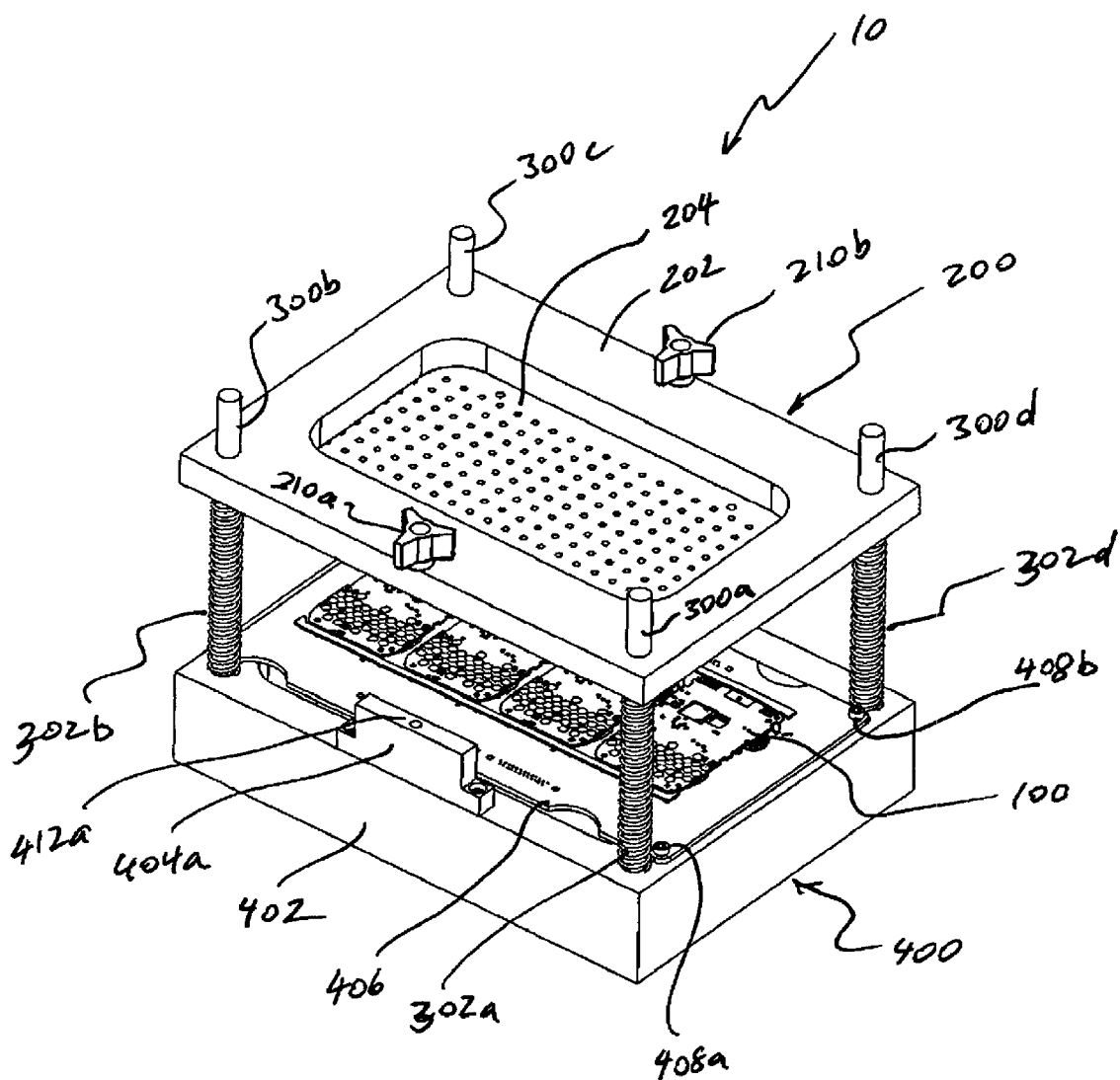
FIG. 1 is a top perspective view illustrated the PCB test fixture in the ready, non-operating position.
Figure 2:
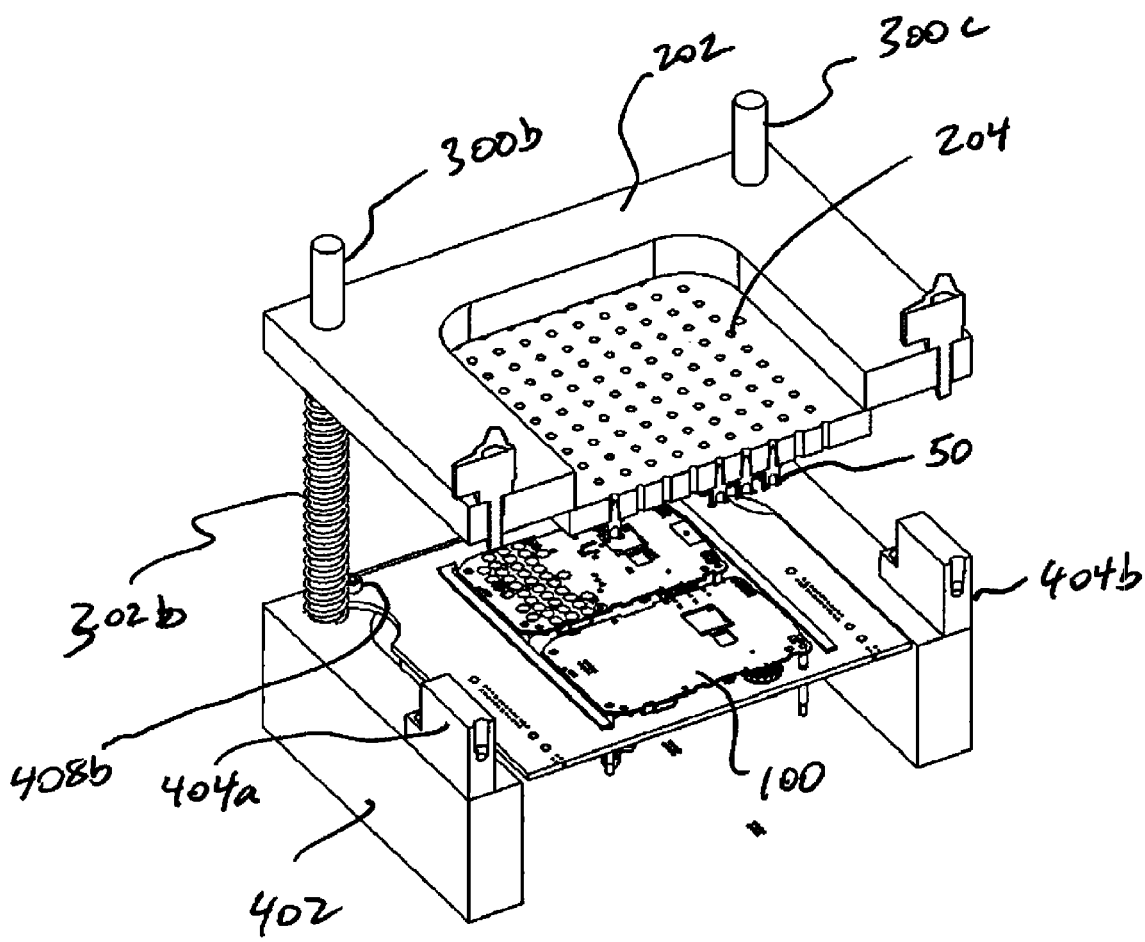
FIG. 2 is a sectional, top perspective view, illustrated the PCB test fixture in the ready, non-operating position.

Referring to FIGS. 1 and 2, there is provided a printed circuit board ("PCB") test fixture 10. The PCB test fixture 10 comprises a support 20, an electrical tester 30, and a pusher 40.

The support 20 is configured for supporting a PCB 100 being tested in a PCB test position 200.

Figure 3A:
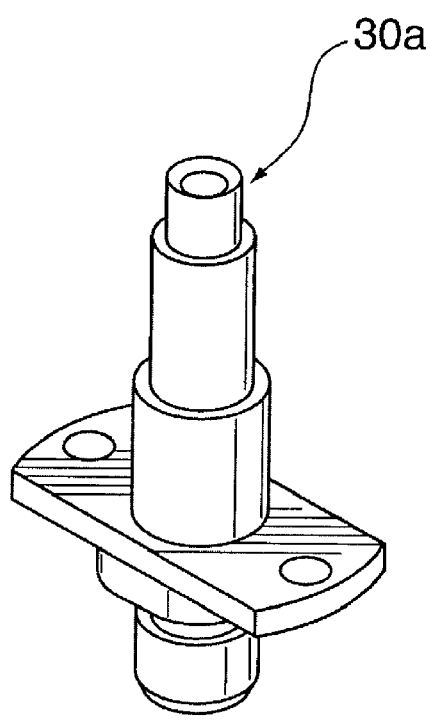
FIGS. 3a and 3b illustrate, respectively, an electrical test probe and an electrical test pin.
Figure 3B:
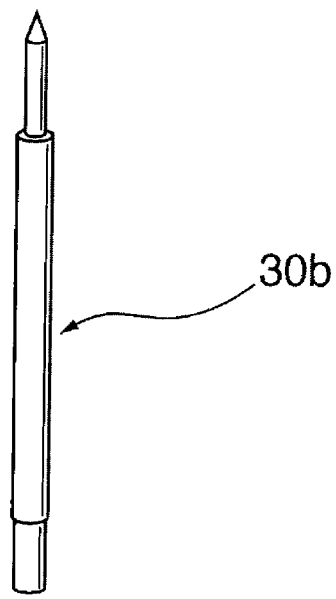

The electrical tester 30 is configured to co-operate with a PCB 100 which is supported by the PCB support 20 and is disposed in the PCB test position such that, when a PCB 100 is supported by the support 20 in the PCB test position, the electrical tester 30 is disposed in electrical contact with a circuit on the PCB 100 positioned by the support 20 in the PCB test position during PCB testing. Referring to FIGS. 3a and 3b, suitable electrical testers 30 include electrical test probes 30a (see FIG. 3a) and electrical test pins 30b (see FIG. 3b). Electrical test probes 30a are used to detect and receive radio frequency signals. Electrical test pins 30b are used to make contact with testing points on the PCB, and receive signals for testing.

The pusher 40 including a plurality of couplers 42. Each one of the plurality of couplers is configured for releasable coupling to a pusher member 50, such that when a plurality of pusher members 50 is provided, each one of the plurality of pusher members 50 is configured for releasable coupling to a one of the plurality of couplers 42 so as to effect releasable coupling of each one of the plurality of pusher members 50 to the pusher 40 and thereby provide an operative plurality of pusher members 50 releasably coupled to the pusher. Each one of the plurality of pusher members is configured to co-operate with the pusher so as to become releasably coupled to and uncoupled from the pusher independently of the releasable coupling and uncoupling of at least another one of the plurality of pusher members. The operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position.

In some embodiments, each one of the plurality of couplers 42 is a receptacle 42. Each one of the plurality of receptacles 42 is configured for releasable coupling to a pusher member 50, such that, for each one of the plurality of receptacles 42, the releasable coupling to the pusher member 50 is effected by an interference fit between the pusher member 50 and a one of the plurality of receptacles 42. When a plurality of pusher members 50 is provided, each one of the plurality of pusher members 50 is configured for releasable coupling to a one of the plurality of receptacles 42 in an interference fit relationship so as to effect releasable coupling of each one of the plurality of pusher members 50 to the pusher 40 and thereby provide an operative plurality of pusher members 50 releasably coupled to the pusher. The operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position.

In some embodiments, the plurality of receptacles 42 is configured such that, with respect to a first plurality of pusher members 50, each one of the first plurality of pusher members 50 is disposed for becoming releasably coupled to a one of the plurality of receptacles 42 in an interference fit relationship so as to effect releasable coupling of the first plurality of pusher members 50 to the pusher and thereby provide a first operative plurality of pusher members 50 releasably coupled to the pusher 40. The first operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position, wherein the first operative plurality of pusher members 50 provides a first spatial arrangement of pusher members 50 relative to the pusher. The plurality of receptacles 42 is further configured such that, with respect to a second plurality of pusher members 50, each one of the second plurality of pusher members 50 is disposed for becoming releasably coupled to a one of the plurality of receptacles 42 in an interference fit relationship so as to effect releasable coupling of the second plurality of pusher members 50 to the pusher 40 and thereby provide a second operative plurality of pusher members 50 releasably coupled to the pusher 40. The second operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position, wherein the second operative plurality of pusher members 50 provides a second spatial arrangement of pusher members 50 relative to the pusher. In this regard, the first spatial arrangement of pusher members 50 is different that the second spatial arrangement of pusher members 50.

In some embodiments, the plurality of receptacles 42 is configured such that, with respect to a first plurality of pusher members 50, each one of the first plurality of pusher members 50 is disposed for becoming releasably coupled to a one of the plurality of receptacles 42 in an interference fit relationship so as to effect releasable coupling of the first plurality of pusher members 50 to the pusher 40 and thereby provide a first operative plurality of pusher members 50 releasably coupled to the pusher. The first operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position. In this respect, the first operative plurality of pusher members 50 provides a first spatial arrangement of pusher members 50 relative to the pusher. Upon uncoupling of the first operative plurality of pusher members 50 from the pusher after the first operative plurality of pusher members 50 has been releasably coupled to the pusher by virtue of the releasable coupling of each one of the first plurality of pusher member 50 to a one of the plurality of receptacles 42, the plurality of couplers 42 is configured such that, with respect to a second plurality of pusher members 50, each one of the second plurality of pusher members 50 is disposed for becoming releasably coupled to a one of the plurality of receptacles 42 in an interference fit relationship so as to effect releasable coupling of the second plurality of pusher members 50 to the pusher 40 and thereby provide a second operative plurality of pusher members 50 releasably coupled to the pusher 40. The second operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position. In this respect, the second operative plurality of pusher members 50 provides a second spatial arrangement of pusher members 50 relative to the pusher, and the first spatial arrangement of pusher members 50 is different that the second spatial arrangement of pusher members 50. For example, with respect to such embodiments described immediately above, upon uncoupling of the second operative plurality of pusher members 50 from the pusher after the second operative plurality of pusher members 50 has been releasably coupled to the pusher by virtue of the releasable coupling of each one of the second plurality of pusher member 50 to a one of the plurality of receptacles 42, the plurality of receptacles 42 is configured such that, with respect to the first plurality of pusher members 50, each one of the first plurality of pusher members 50 is disposed for becoming releasably coupled to a one of the plurality of receptacles 42 so as to effect releasable coupling of the first plurality of pusher members 50 to the pusher and provide the first operative plurality of pusher members 50 coupled to the pusher 40. The first operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position, wherein the first operative plurality of pusher members provides the first spatial arrangement of pusher members 50 relative to the pusher.

In some embodiments, the plurality of receptacles 42 is configured such that, with respect to a first plurality of pusher members 50, each one of the first plurality of pusher members 50 is disposed for becoming releasably coupled to a one of the plurality of receptacles 42 in an interference fit relationship such that the first plurality of pusher members 50 is releasably coupled to a first plurality of receptacles 42 so as to effect releasable coupling of the first plurality of pusher members 50 to the pusher 40 and thereby provide a first operative plurality of pusher members 50 releasably coupled to the pusher 40. The first operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position. The plurality of receptacles 42 is further configured such that, with respect to a second plurality of pusher members 50, each one of the second plurality of pusher members 50 is disposed for becoming releasably coupled to a one of the plurality of receptacles 42 in an interference fit relationship such that the second plurality of pusher members 50 is releasably coupled to a second plurality of receptacles 42 so as to effect releasable coupling of the second plurality of pusher members 50 to the pusher and thereby provide a second operative plurality of pusher members 50 releasably coupled to the pusher 40. The second operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position. In this respect, the first plurality of receptacles 42 is different that the second plurality of receptacles 42.

In some embodiments, the plurality of receptacles 42 is configured such that, with respect to a first plurality of pusher members 50, each one of the first plurality of pusher members 50 is disposed for becoming releasably coupled to a one of the plurality of receptacles 42 in an interference fit relationship such that the first plurality of pusher members 50 is releasably coupled to a first plurality of receptacles 42 so as to effect releasable coupling of the first plurality of pusher members 50 to the pusher and thereby provide a first operative plurality of pusher members 50 releasably coupled to the pusher 40. The first operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position. Upon uncoupling of the first operative plurality of pusher members 50 from the pusher after the first operative plurality of pusher members 50 has been releasably coupled to the pusher by virtue of the releasable coupling of each one of the first plurality of pusher member 50 to a one of the plurality of receptacles 42, the plurality of couplers 42 is configured such that, with respect to a second plurality of pusher members 50, each one of the second plurality of pusher members 50 is disposed for becoming releasably coupled to a one of the plurality of receptacles 42 in an interference fit relationship such that the second plurality of pusher members 50 is releasably coupled to a second plurality of receptacles 42 so as to effect releasable coupling of the second plurality of pusher members 50 to the pusher 40 and thereby provide a second operative plurality of pusher members 50 releasably coupled to the pusher 40. The second operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position. In this respect, the first plurality of receptacles 42 is different that the second plurality of receptacles 42. For example, with respect to such embodiments described immediately above, upon uncoupling of the second operative plurality of pusher members 50 from the pusher after the second operative plurality of pusher members 50 has been releasably coupled to the pusher by virtue of the releasable coupling of each one of the second plurality of pusher members 50 to a one of the plurality of receptacles 42, the plurality of receptacles 42 is configured such that, with respect to the first plurality of pusher members 50, each one of the first plurality of pusher members 50 is disposed for becoming releasably coupled to a one of the plurality of receptacles 42 such that the first plurality of receptacles 42 is releasably coupled to the first plurality of receptacles 42 so as to effect releasable coupling of the first plurality of pusher members 50 to the pusher 40 and provide the first operative plurality of pusher members 50. The first operative plurality of pusher members 50 is configured for translating, to a PCB 100 which is supported by the PCB support 20 and is disposed in the PCB test position, a force being applied by the pusher so as to effect pressing of a circuit of the PCB 100 against the electrical tester when the PCB 100 is supported on the PCB support 20 and disposed in the PCB test position.

With respect to the terms: "first plurality of pusher members" and "second plurality of pusher members", as they are used herein, it is understood that the number of pusher members in a "first plurality of pusher members" may be the same or different than the number of pusher members in a "second plurality of pusher members. Additionally, each one of the pusher members in a "first plurality of pusher members" may be identical to at least one of the pusher members in a "second plurality of pusher members", or only some of the pusher members in a "first plurality of pusher members" may be identical to at least one of the pusher members in a "second plurality of pusher members", or none of the pusher members in a "first plurality of pusher members" is identical to any one of the pusher members in a "second plurality of pusher members". Further, each one of the pusher members in a "second plurality of pusher members" may be identical to at least one of the pusher members in a "first plurality of pusher members", or only some of the pusher members in a "second plurality of pusher members" may be identical to at least one of the pusher members in a "first plurality of pusher members".

In some embodiments, the test fixture 10 includes a push module 200 and a base module 400.

The push module 200 is coupled to the base module 400 through co-operation between guiding rods 300a, 300b, 300c, and 300d, compression springs 302a, 302b, 302c, and 302d (302c is not shown), and receptacles provided in each one of the push module 200 and the base module 400. The receptacles in the base module 400 are provided in the form of four mating holes provided in a lower frame 402, and each one of these four mating holes receives and is engaged with one end of a respective one of the guiding rods 300a, 300b, 300c, and 300d in an interference fit relationship. The receptacles in the push module 200 are provided in the form of four throughbores or fitting holes 220a, 220b, 220c, and 220d (see FIG. 4) provided in an upper frame 202, and each one of these four mating holes slidably receive a second end of a respective one of the guiding rods 300a, 300b, 300c, and 300d to facilitate guided movement of the push module 200 relative to the base module 400. Each one of the compression springs 302a, 302b, 302c, and 302d is wound about the periphery of a respective one of the guiding rods 300a, 300b, 300c, and 300d and positioned between the push module 200 and the base module 400 to effect support of the push module 200 and bias positioning of the push module 200 such that the push module 200 is disposed in a spaced-apart relationship relative to the base module 400.

Figure 4:
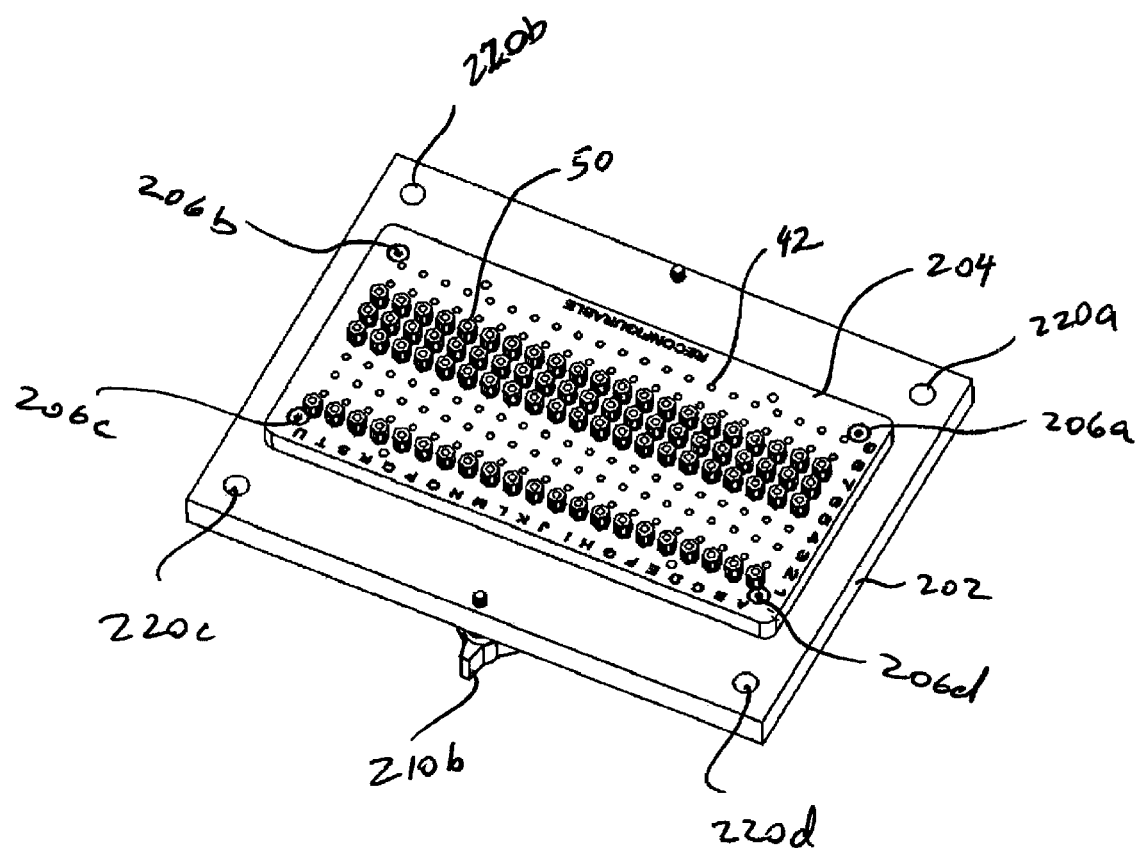
FIG. 4 is a top perspective view of one side of the upper frame of the upper subassembly of the PCB test fixture, with the push plate, including an arrangement of pusher fingers, coupled to the upper frame.

The upper frame 202 receives a push plate 204. Referring to FIG. 4, the push plate 204 is characterized by a substantially rectangular shape. The illustrated push plate 204 includes a plurality of receptacles 42 in an exemplary form of apertures which are labelled in column from A to U, and in row from 1 to 9 for facilitating convenient locating of pusher members 50. The centre distances between adjacent apertures in both directions are substantially the same. The push plate 204 illustrated in FIG. 4 is configured for releasable coupling to the pusher member 50 and is shown releasably coupled to a plurality of pusher members 50. With respect to the pusher member 50, a suitable exemplary pusher member 50 is a pusher finger 50 such as McMaster-Carr Part No. 94662A431 (see www.mcmaster.com). This pusher finger 50 is releasably coupled to the push plate 204 illustrated in FIG. 4 by inserting the pusher finger 50 into one of the apertures provided in the push plate 204. The diameter of the apertures is machined so as to effect an interference fit with the pusher finger 50 upon insertion of the pusher finger 50. The interference fit is not excessively tight, so as to enable removal of the pusher finger 50 from the base plate, and sufficiently tight so as to remain fixed in position relative to the push plate 204 while urging the PCB 100 to be tested against the electrical tester 30.

Figure 5:
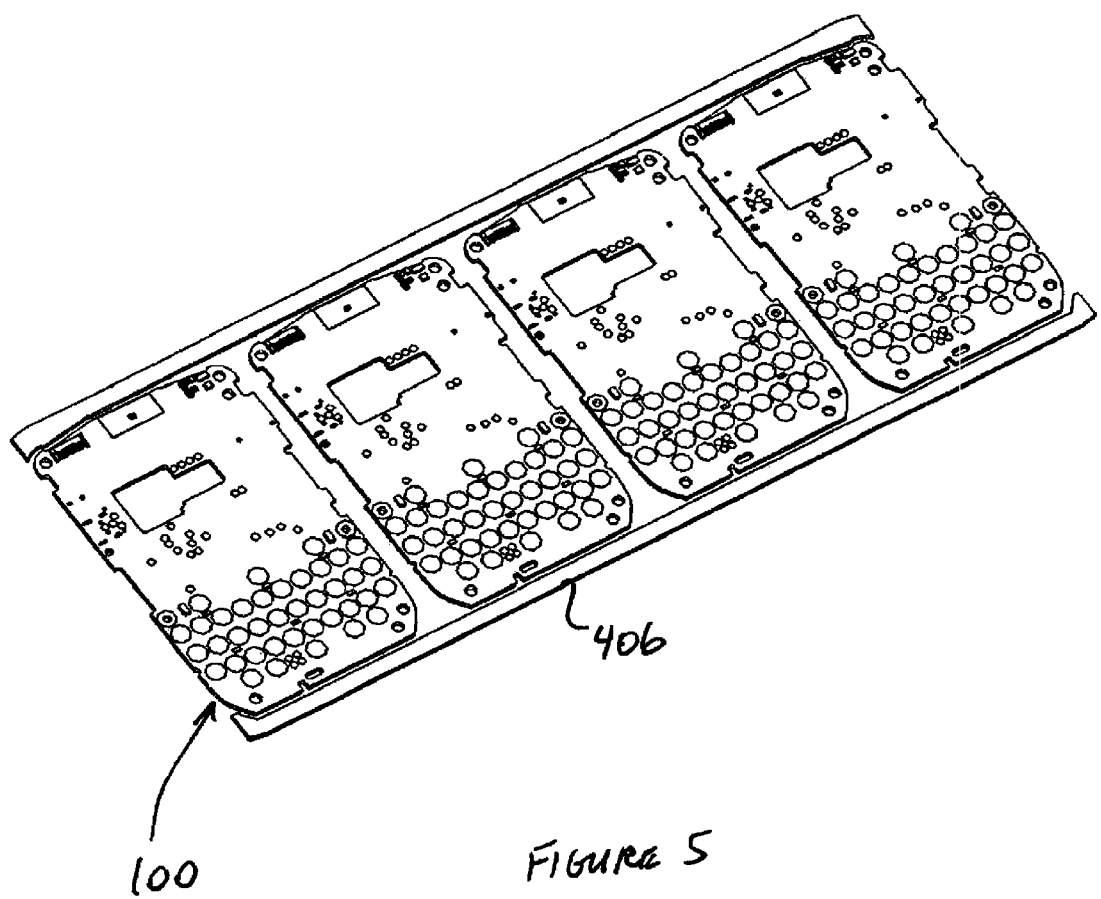
FIG. 5 is a bottom perspective view of one side of a first set of identical PCB's supported on the probe plate for testing, illustrating the side of the PCB's which make contact with the electrical test probes and electrical test pins, and for which the arrangement of pusher fingers in FIG. 4 is configured.
Figure 6:
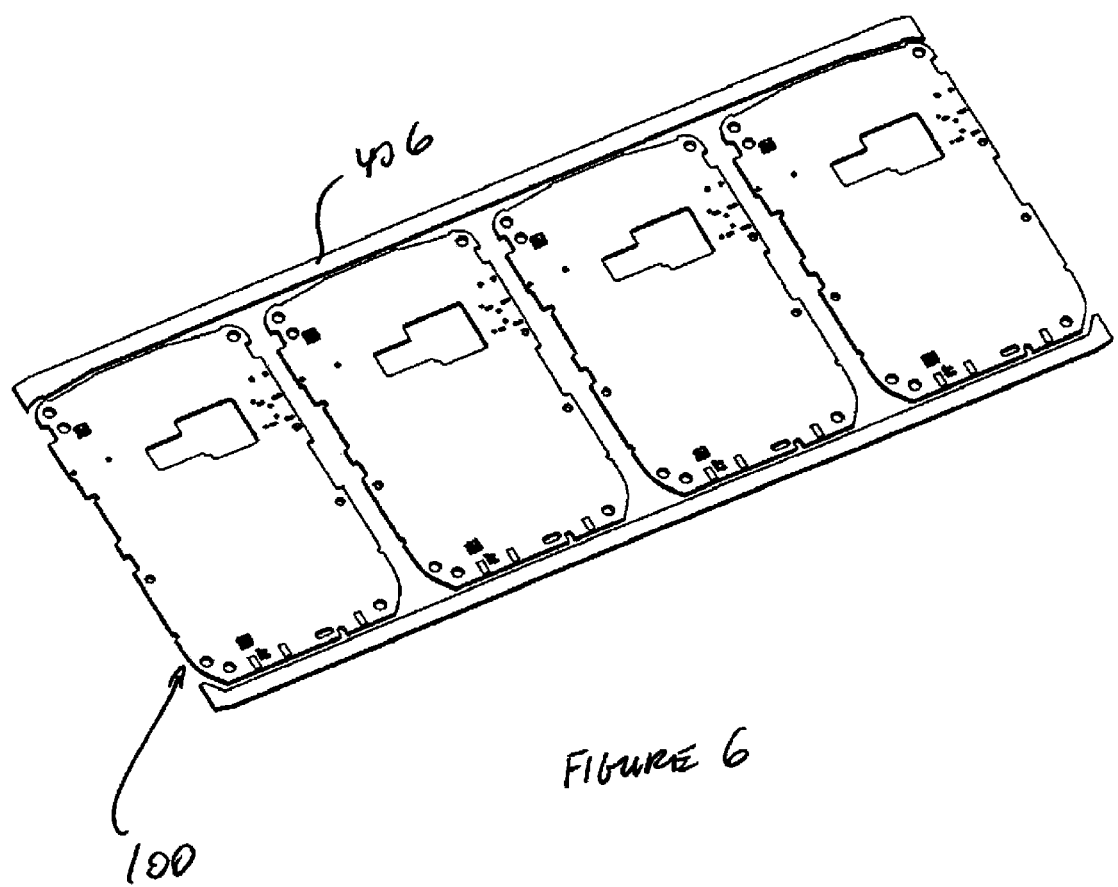
FIG. 6 is a top perspective view of another side of the first set of identical PCB's illustrated in FIG. 5, supported on the support plate for testing, showing the side of the PCB's which is configured to make contact with the pusher fingers.
Figure 7:
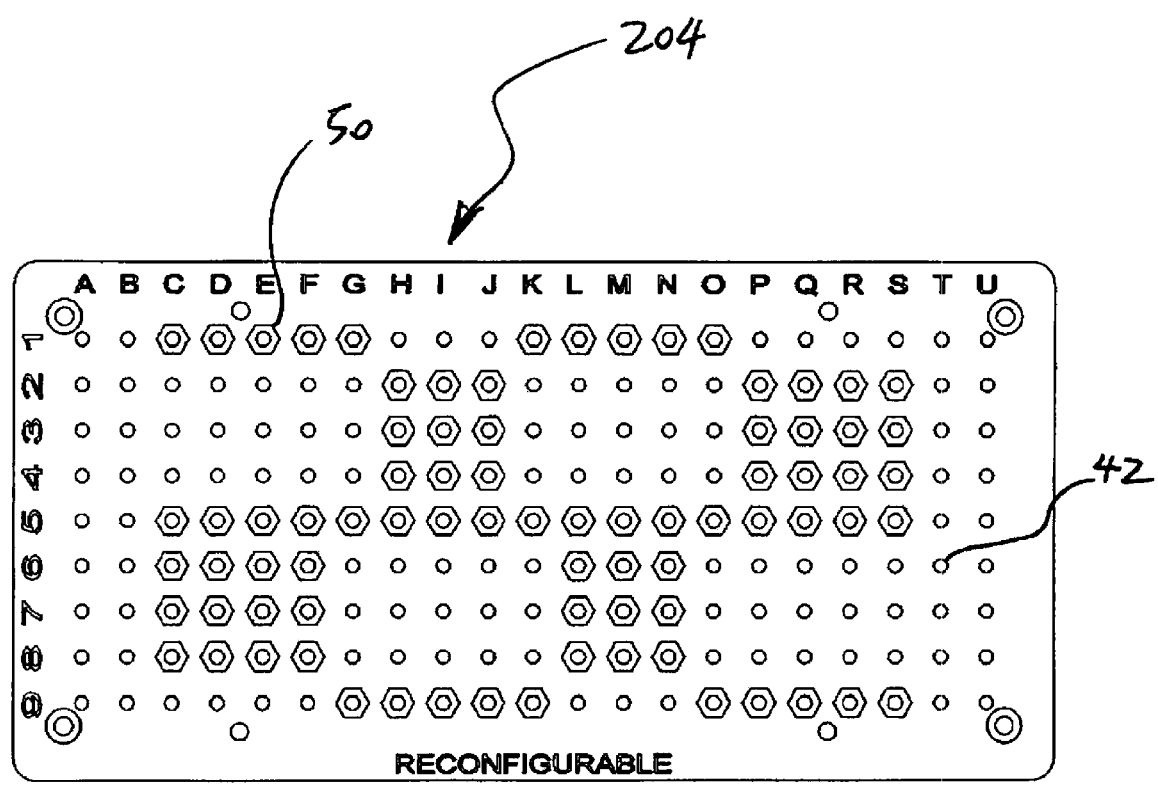
FIG. 7 is a top plan view of one side of the push plate illustrated in FIG. 4, but including a different arrangement of pusher fingers than that illustrated in FIG. 4.
Figure 8:
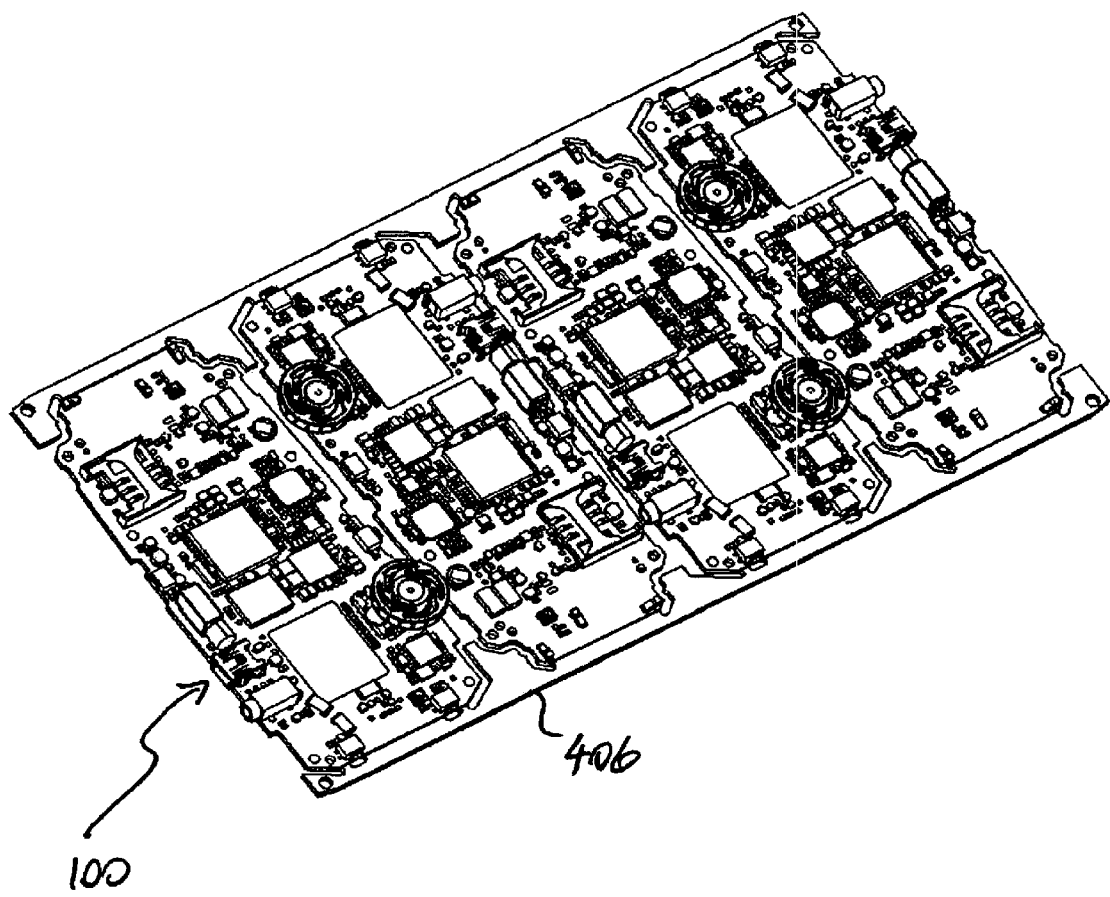
FIG. 8 is a bottom perspective view of one side of a second set of identical PCB's supported on the probe plate for testing, illustrating the side of the PCB's which make contact with the electrical test probes and electrical test pins, and for which the arrangement of pusher fingers in FIG. 7 is configured.
Figure 9:
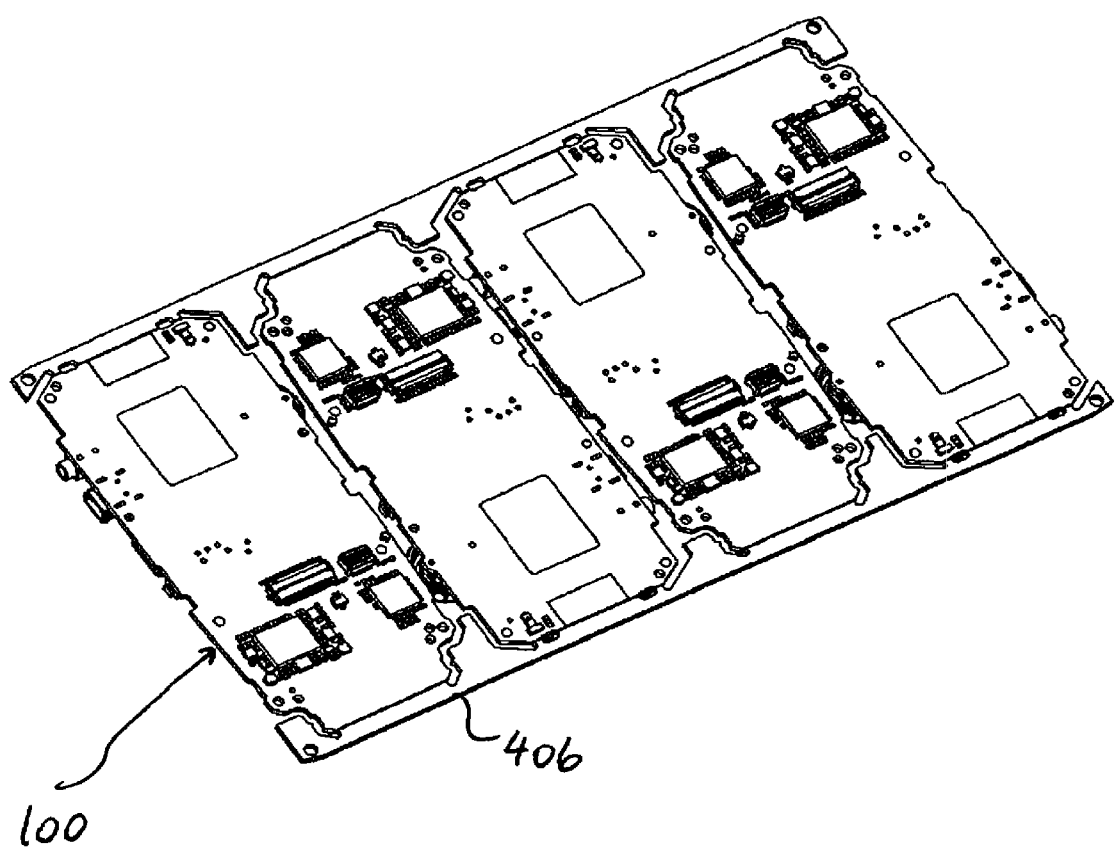
FIG. 9 is a top perspective view of another side of the second set of identical PCB's illustrated in FIG. 8, supported on the support plate for testing, showing the side of the PCB's which is configured to make contact with the pusher fingers.
Figure 10:
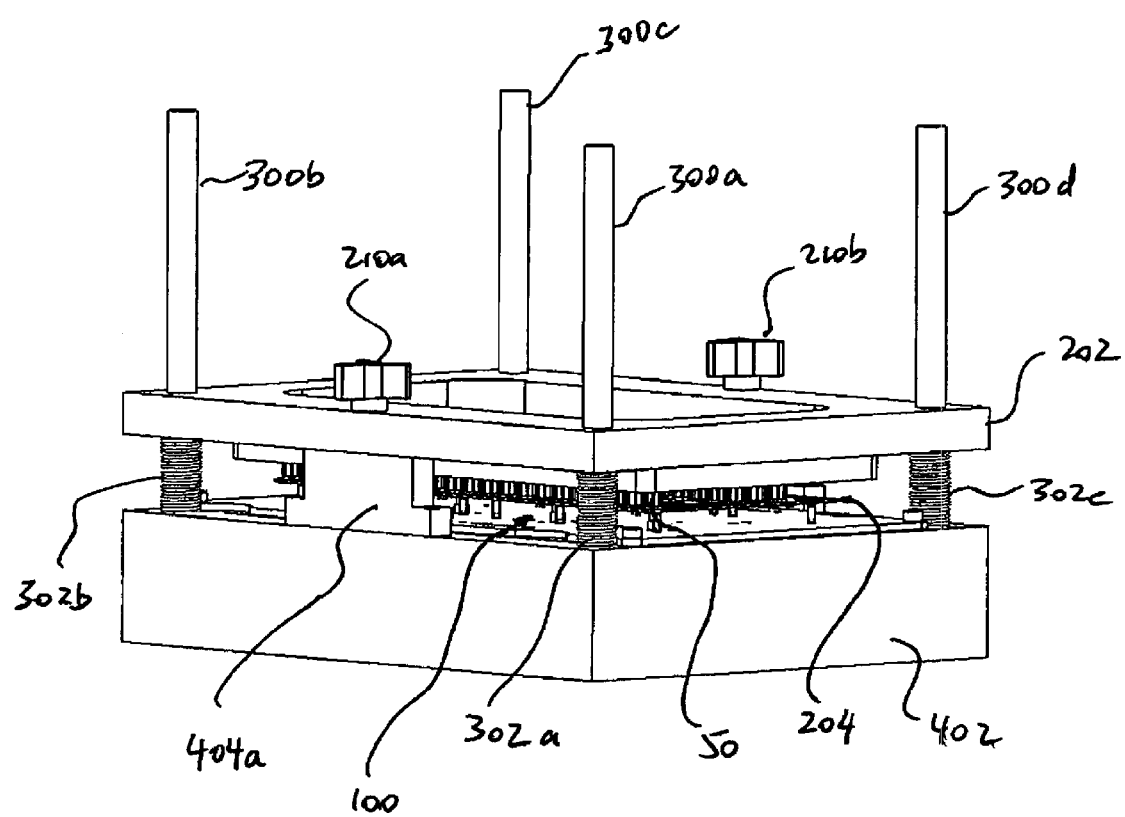
FIG. 10 is a top perspective view illustrating the PCB test fixture in the operating position, with the pusher fingers urging the PCB's into contact with the electrical test probes and the electrical test pines.
Figure 11:
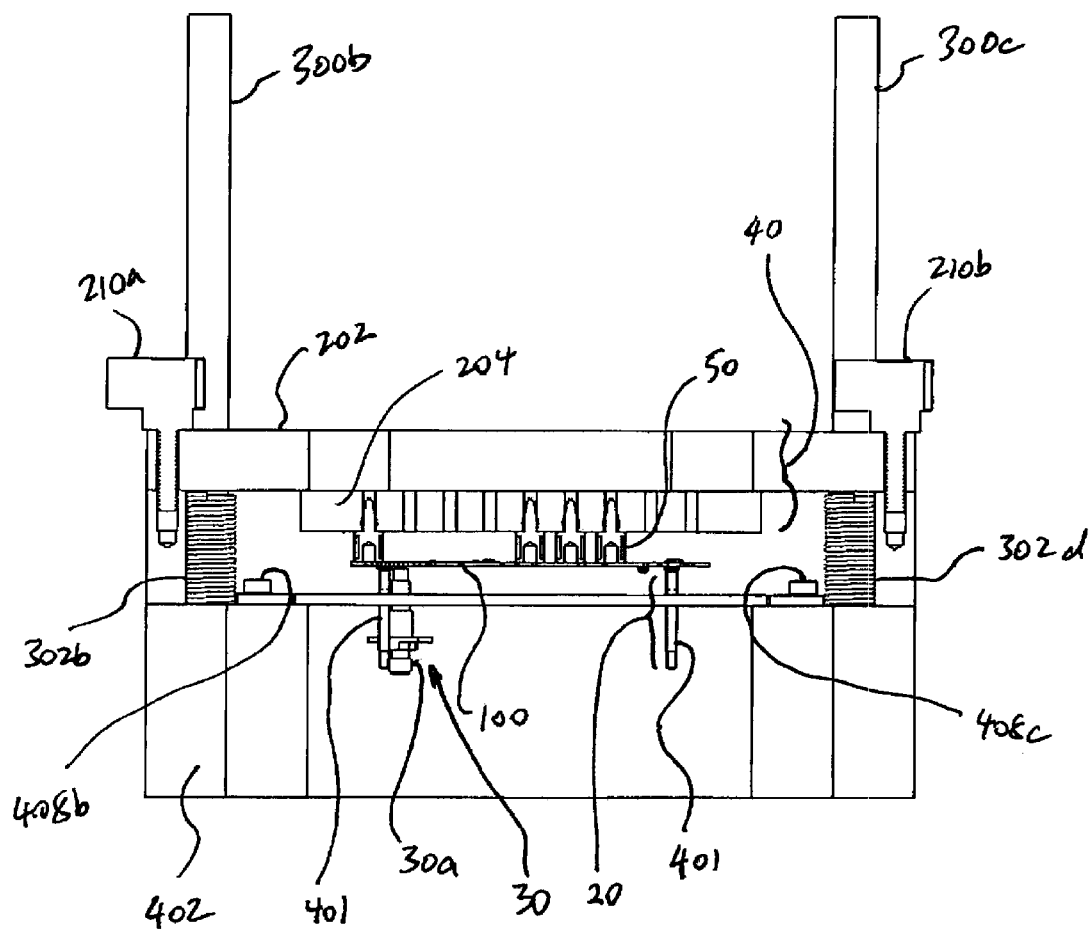
FIG. 11 is a sectional side elevation view of the operating position of the PCB test fixture illustrated in FIG. 10.

The pusher fingers 50 can be releasably coupled to the push plate 204 in different patterns to suit different PCBs 100 to be tested. The spatial arrangement of pusher fingers in FIG. 4 is configured for use when testing three identical PCB's 100 illustrated in FIGS. 5 and 6. FIG. 7 illustrates a further exemplary pattern of pusher fingers 50 coupled to the push plate 204, different from the pattern illustrated in FIG. 4. The FIG. 7 arrangement of pusher fingers is configured for use when testing three identical PCB's 100 illustrated in FIGS. 8 and 9. In some cases, the surface of a first PCB (FIGS. 5 and 6) is contoured differently from the surface of a second PCB (FIGS. 8 and 9), such that one pattern of pusher fingers 50 for urging the first PCB into a PCB test position would not be suitable for urging the second PCB into a PCB test position, and a different pattern of pusher fingers 50 is required in order to urge the second PCB into a PCB test position.

The push plate 204 is mounted to the upper frame 202 such that the pusher fingers 50 are disposed in a spatial arrangement so as to press against a PCB 100 supported on the lower subassembly 400 upon moving the upper assembly 200 towards the lower assembly 400. Coupling of the push plate 204 to the upper frame 202 is effected using four flat head screws 206a, 206b, 206c, 206d which extend though countersink holes provided in the push plate 204 and are thereby threadably received in the upper frame 202.

The base module 400 includes the lower frame 402, stop 404, and probe plate 406. The probe plate 406 includes radio frequency ("RF") probes 30a, test pins 30b, and support pins 401. The probe plate 406 is secured to the lower frame 402 with screws 408a, 408b, 408c, and 408d. The PCB's 100 for testing are supported on the upper surface of the probe plate 406, and are located and further supported by the support pins 401. Two stops 410a, 410b are mounted on both sides of the lower frame 402 with screws 412a, 412b (412b is not shown). The stops 410a, 410b are sufficiently elevated over the PCB's 100 being tested such that the PCB's 100 being tested are not over-compressed while still ensuring that reliable contacts between the PCB's being tested and (i) the RF probes and (ii) the test pins are effected.

The operation of this embodiment of the PCB test fixture 10 will now be described. FIG. 1 illustrates the test fixture 10 in a ready, non-operating position. The push plate 204 is spaced apart from the PCB's being tested. The upper frame 202 is forced downwardly against the biasing force of the compression springs 302a, 302b, 302c, and 302d to effect guided, downward movement along guiding rods 300a, 300b, 300c, and 300d until the upper frame 202 bottoms out against the stops 410a, 410b. Once in this position, threaded knobs 210a, 210b, located on the upper frame 202, are turned to as to threadably engage mating threaded holes provided in each one of the stops 410a, 410b (only one hole, hole 412a on stop 410a, is shown), and thereby secure the upper frame 202 to the lower frame 402. In this position, the test fixture is in the operative position, wherein the pusher fingers 50 are pressing down on the PCB's 100 to be tested to effect reliable contacts between the PCB's being tested and (i) the RF probes 30a and (ii) the test pins 30b. Once the testing is completed, the knobs 210a, 210b are unsecured from the stops 410a, 410b. The upper frame 202 is then lifted by the spring force of the compression springs 302a, 302b, 302c, and 302d to force the opening of the test fixture 10. The PCB's 100 can now be removed and replaced with new PCB's to be tested. If it is desired to reconfigure the spatial arrangement of pusher fingers 50 on the push plate 204, the push plate 204 can be removed from the upper frame 202 by removing screws 206a, 206b, 206c, 206d and the pusher fingers 50 can then be removed or inserted in different receptacles 42 by hand.

In some embodiments, the PCB test fixture 10 is mechanically actuated using a lever. In other embodiments, the PCB test fixture is vacuum actuated. Further, in some embodiments, the PCB test fixture 10 is gas (for example, air) pressure actuated.

Figure 12:
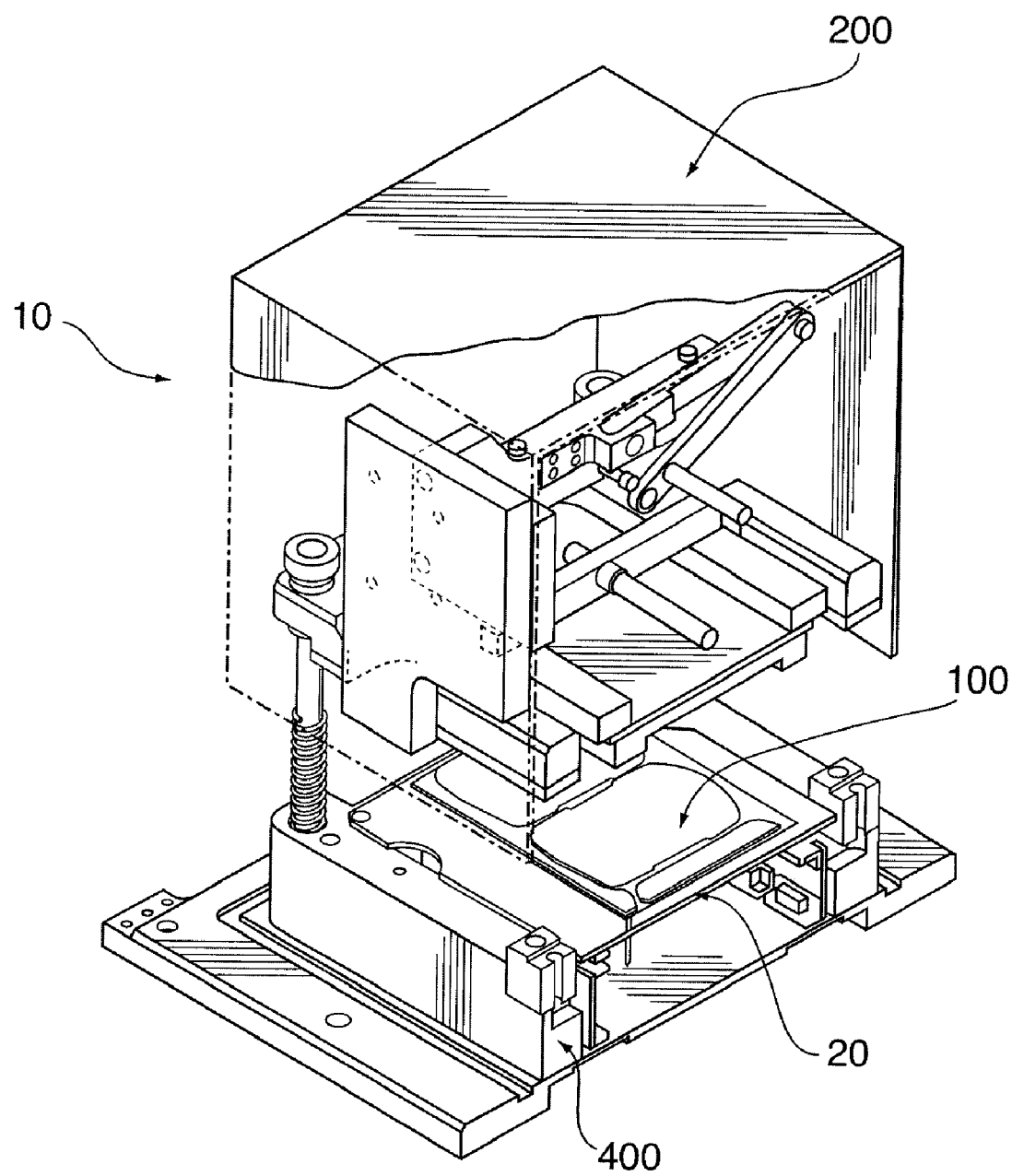
FIG. 12 is sectional top perspective view of another embodiment of a test fixture.
Figure 13:
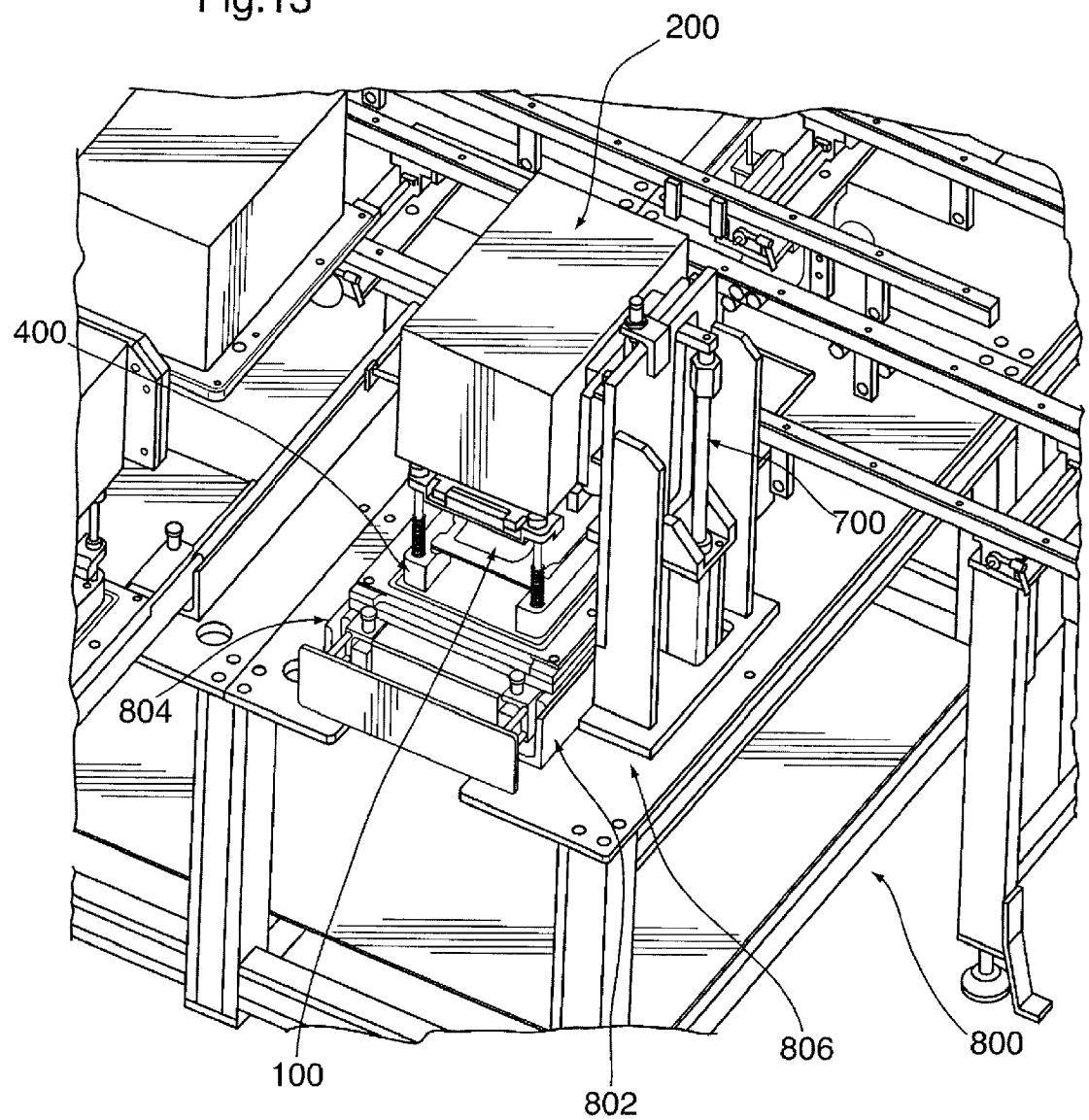
FIG. 13 is a top perspective view of the test fixture illustrated in FIG. 12 mounted on an automatic testing machine.

In some embodiments, and referring to FIGS. 12 and 13, the PCB text fixture 10 is mounted on top of two sliding rails 802, 804 which are attached to the platform 806 of an automatic testing machine 800. The push module 200 is attached to a hydraulically activated driving cylinder 700. The cylinder 700 effects displacement of the push module 200 relative to the base module 400. The cylinder 700 moves up and lifts the push module 200, opening the text fixture 10. A robotic arm (part of the automatic testing machine 800, and not shown) picks and loads the PCB 100 for testing on the support 20. The fixture 10 is then closed by lowering the push module 200 with the cylinder 700. Testing is then performed. When testing is completed, the fixture 10 is open again and the tested PCB 100 is removed by the robotic arm. A new PCB 100 is then loaded by the robotic arm to begin the next round of testing.

In the above description, for purposes of explanation, numerous details are set forth in order to provide a thorough understanding of the present disclosure. However, it will be apparent to one skilled in the art that these specific details are not required in order to practice the present disclosure. Although certain dimensions and materials are described for implementing the disclosed example embodiments, other suitable dimensions and/or materials may be used within the scope of this disclosure. All such modifications and variations, including all suitable current and future changes in technology, are believed to be within the sphere and scope of the present disclosure. All references mentioned are hereby incorporated by reference in their entirety.

What is claimed is:

1. A printed circuit board ("PCB") test fixture comprising:
    a support for supporting a PCB being tested in a PCB test position;
    an electrical tester positioned to co-operate with a PCB which is supported by the PCB support and is disposed in the PCB test position such that, when a PCB is supported by the support in the PCB test position, the electrical tester is disposed in electrical contact with a circuit on the PCB;
    a pusher configured for releasable coupling to a plurality of pusher members, such that each one of the plurality of pusher members is configured to co-operate with the pusher so as to become releasably coupled to and uncoupled from the pusher independently of the releasable coupling and uncoupling of at least another one of the plurality of pusher members, and such that an operative plurality of pusher members is provided when each one of the plurality of pusher members is releasably coupled to the pusher, wherein the operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position.

2. The PCB test fixture as claimed in claim 1,
    wherein the plurality of pusher members is a first plurality of pusher members, and the pusher is configured for releasable coupling to the first plurality of pusher members such that the releasable coupling of the first plurality of pusher members to the pusher effects a first spatial arrangement of pusher members relative to the pusher;
    and wherein the plurality of pusher members is a second plurality of pusher members, and the pusher is also configured for releasable coupling to the second plurality of pusher members such that the releasable coupling of the second plurality of pusher members to the pusher effects a second spatial arrangement of pusher members relative to the pusher;
    and wherein the first spatial arrangement of pusher members is different than the second spatial arrangement of pusher members.

3. The PCB test fixture as claimed in claim 1,
wherein the pusher is configured for releasable coupling to a first plurality of pusher members, such that each one of the first plurality of pusher members is configured to co-operate with the pusher so as to become releasably coupled to and uncoupled from the pusher member independently of the releasable coupling and uncoupling of another one of the first plurality of pusher members, and such that an operative first plurality of pusher members is provided when each one of the first plurality of pusher members is releasably coupled to the pusher, wherein the operative first plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the releasable coupling of the first operative plurality of pusher members to the pusher effects a first spatial arrangement of pusher members relative to the pusher;

and upon uncoupling of the first plurality of pusher members from the pusher after the first plurality of pusher members has been releasably coupled to the pusher, the pusher is configured for releasable coupling to a second plurality of pusher members, such that each one of the second plurality of pusher members is configured to co-operate with the pusher so as to become releasably coupled to and uncoupled from the pusher member independently of the releasable coupling and uncoupling of another one of the second plurality of pusher members, and such that an operative second plurality of pusher members is provided when each one of the second plurality of pusher members is releasably coupled to the pusher, wherein the operative second plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the releasable coupling of the second operative plurality of pusher members to the pusher effects a second spatial arrangement of pusher members relative to the pusher;

such that the releasable coupling of the second plurality of pusher members to the pusher effects a second spatial arrangement of pusher members relative to the pusher;

and wherein the first spatial arrangement of pusher members is different than the second spatial arrangement of pusher members.

4. The PCB test fixture as claimed in claim 3,
wherein, upon uncoupling of the second operative plurality of pusher members from the pusher after the second operative plurality of pusher members had been releasably coupled to the pusher, the pusher is configured for releasable coupling to each one of the first plurality of pusher members to provide the first operative plurality of pusher members which effects the first spatial arrangement of pusher members relative to the pusher.

5. The PCB test fixture as claimed in claim 1,
wherein, for each one of the at least one pusher member, the releasable coupling to the pusher is effected by an interference fit between the pusher member and the pusher.

6. The PCB test fixture as claimed in claim 1,
wherein the pusher is positionable relative to the support.

7. The PCB test fixture as claimed in claim 1,
wherein the pusher including a plurality of couplers, wherein each one of the plurality of couplers is configured for releasable coupling to a pusher member, such that when a plurality of pusher members is provided, each one of the plurality of pusher members is configured for releasable coupling to a one of the plurality of couplers so as to effect releasable coupling of each one of the plurality of pusher members to the pusher and thereby provide an operative plurality of pusher members releasably coupled to the pusher, wherein the operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position.

8. The PCB test fixture as claimed in claim 7,
wherein, for each one of the plurality of couplers, the releasable coupling to the pusher member is effected by an interference fit between the coupler and the pusher member.

9. The PCB test fixture as claimed in claim 7,
wherein the plurality of couplers is configured such that, with respect to a first plurality of pusher members, each one of the first plurality of pusher members is disposed for becoming releasably coupled to a one of the plurality of couplers so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the first operative plurality of pusher members provides a first spatial arrangement of pusher members relative to the pusher;

and wherein the plurality of couplers is further configured such that, with respect to a second plurality of pusher members, each one of the second plurality of pusher members is disposed for becoming releasably coupled to a one of the plurality of couplers so as to effect releasable coupling of the second plurality of pusher members to the pusher and thereby provide a second operative plurality of pusher members releasably coupled to the pusher, wherein the second operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the second operative plurality of pusher members provides a second spatial arrangement of pusher members relative to the pusher;

and wherein the first spatial arrangement of pusher members is different than the second spatial arrangement of pusher members.

10. The PCB test fixture as claimed in claim 7,
wherein the plurality of couplers is configured such that, with respect to a first plurality of pusher members, each one of the first plurality of pusher members is disposed for becoming releasably coupled to a one of the plurality of couplers in an interference fit relationship so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, and wherein the first operative plurality of pusher members provides a first spatial arrangement of pusher members relative to the pusher;

and wherein the plurality of couplers is further configured such that, with respect to a second plurality of pusher members, each one of the second plurality of pusher members is disposed for becoming releasably coupled to a one of the plurality of couplers in an interference fit relationship so as to effect releasable coupling of the second plurality of pusher members to the pusher and thereby provide a second operative plurality of pusher members releasably coupled to the pusher, wherein the second operative plurality of pusher members is configured for translating, to a PCB disposed between the pusher and the support, a force being applied by the pusher so as to effect pressing of a circuit of the PCB against the electrical tester when the PCB is supported on the PCB support and disposed in the PCB test position, wherein the second operative plurality of pusher members provides a second spatial arrangement of pusher members relative to the pusher;

and wherein the first spatial arrangement of pusher members is different than the second spatial arrangement of pusher members.

11. The PCB test fixture as claimed in claim 7, wherein the plurality of couplers is configured such that, with respect to a first plurality of pusher members, each one of the first plurality of pusher members is disposed for becoming releasably coupled to a one of the plurality of couplers so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the first operative plurality of pusher members provides a first spatial arrangement of pusher members relative to the pusher;

and upon uncoupling of the first operative plurality of pusher members from the pusher after the first operative plurality of pusher members has been releasably coupled to the pusher by virtue of the releasable coupling of each one of the first plurality of pusher member to a one of the plurality of couplers, the plurality of couplers is configured such that, with respect to a second plurality of pusher members, each one of the second plurality of pusher members is disposed for becoming releasably coupled to a one of the plurality of couplers so as to effect releasable coupling of the second plurality of pusher members to the pusher and thereby provide a second operative plurality of pusher members releasably coupled to the pusher, wherein the second operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the second operative plurality of pusher members provides a second spatial arrangement of pusher members relative to the pusher;

and wherein the first spatial arrangement of pusher members is different than the second spatial arrangement of pusher members.

12. The PCB test fixture as claimed in claim 11, wherein, upon uncoupling of the second operative plurality of pusher members from the pusher after the second operative plurality of pusher members has been releasably coupled to the pusher by virtue of the releasable coupling of each one of the second plurality of pusher member to a one of the plurality of couplers, the plurality of couplers is configured such that, with respect to the first plurality of pusher members, each one of the first plurality of pusher members is disposed for becoming releasably coupled to a one of the plurality of couplers so as to effect releasable coupling of the first plurality of pusher members to the pusher and provide the first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the first operative plurality of pusher members provides the first spatial arrangement of pusher members relative to the pusher.

13. The PCB test fixture as claimed in claim 7, wherein the plurality of couplers is configured such that, with respect to a first plurality of pusher members, each one of the first plurality of pusher members is disposed for becoming releasably coupled to a one of the plurality of couplers in an interference fit relationship so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the first operative plurality of pusher members provides a first spatial arrangement of pusher members relative to the pusher;

and upon uncoupling of the first plurality of pusher members from the pusher after the first plurality of pusher members has been releasably coupled to the pusher by virtue of the releasable coupling of each one of the first plurality of pusher member to a one of the plurality of couplers, the plurality of couplers is configured such that, with respect to a second plurality of pusher members, each one of the second plurality of pusher members is disposed for becoming releasably coupled to a one of the plurality of couplers in an interference fit relationship so as to effect releasable coupling of the second plurality of pusher members to the pusher and thereby provide a second operative plurality of pusher members releasably coupled to the pusher, wherein the second operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the second operative plurality of pusher members provides a second spatial arrangement of pusher members relative to the pusher.

14. The PCB test fixture as claimed in claim 13,
wherein, upon uncoupling of the second operative plurality of pusher members from the pusher after the second operative plurality of pusher members has been releasably coupled to the pusher by virtue of the releasable coupling of each one of the second plurality of pusher member to a one of the plurality of couplers, the plurality of couplers is configured such that, with respect to the first plurality of pusher members, each one of the first plurality of pusher members is disposed for becoming releasably coupled to a one of the plurality of couplers in an interference fit relationship so as to effect releasable coupling of the first plurality of pusher members to the pusher and provide the first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the first operative plurality of pusher members provides the first spatial arrangement of pusher members relative to the pusher.

15. The PCB test fixture as claimed in claim 7,
wherein each one of the plurality of couplers is a receptacle, wherein each one of the plurality of receptacles is configured for releasable coupling to a pusher member, such that when a plurality of pusher members is provided, each one of the plurality of pusher members is configured for releasable coupling to a one of the plurality of couplers in an interference fit relationship so as to effect releasable coupling of each one of the plurality of pusher members to the pusher and thereby provide an operative plurality of pusher members releasably coupled to the pusher, wherein the operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position.

16. The PCB test fixture as claimed in claim 15,
wherein the plurality of receptacles is configured such that, with respect to a first plurality of pusher members, each one of the first plurality of pusher members is disposed for becoming releasably coupled to a one of the plurality of receptacles in an interference fit relationship so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the first operative plurality of pusher members provides a first spatial arrangement of pusher members relative to the pusher;

and wherein the plurality of receptacles is further configured such that, with respect to a second plurality of pusher members, each one of the second plurality of pusher members is disposed for becoming releasably coupled to a one of the plurality of receptacles in an interference fit relationship so as to effect releasable coupling of the second plurality of pusher members to the pusher and thereby provide a second operative plurality of pusher members releasably coupled to the pusher, wherein the second operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, and wherein the second operative plurality of pusher members provides a second spatial arrangement of pusher members relative to the pusher;

and wherein the first spatial arrangement of pusher members is different than the second spatial arrangement of pusher members.

17. The PCB test fixture as claimed in claim 15,
wherein the plurality of receptacles is configured such that, with respect to a first plurality of pusher members, each one of the first plurality of pusher members is disposed for becoming releasably coupled to a one of the plurality of receptacles in an interference fit relationship so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, and wherein the first operative plurality of pusher members provides a first spatial arrangement of pusher members relative to the pusher;

and upon uncoupling of the first operative plurality of pusher members from the pusher after the first operative plurality of pusher members has been releasably coupled to the pusher by virtue of the releasable coupling of each one of the first plurality of pusher member to a one of the plurality of receptacles, the plurality of couplers is configured such that, with respect to a second plurality of pusher members, each one of the second plurality of pusher members is disposed for becoming releasably coupled to a one of the plurality of receptacles in an interference fit relationship so as to effect releasable coupling of the second plurality of pusher members to the pusher and thereby provide a second operative plurality of pusher members releasably coupled to the pusher, wherein the second operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, and wherein the second operative plurality of pusher members provides a second spatial arrangement of pusher members relative to the pusher;

and wherein the first spatial arrangement of pusher members is different than the second spatial arrangement of pusher members.

18. The PCB test fixture as claimed in claim 17, wherein, upon uncoupling of the second operative plurality of pusher members from the pusher after the second operative plurality of pusher members has been releasably coupled to the pusher by virtue of the releasable coupling of each one of the second plurality of pusher member to a one of the plurality of receptacles, the plurality of receptacles is configured such that, with respect to the first plurality of pusher members, each one of the first plurality of pusher members is disposed for becoming releasably coupled to a one of the plurality of receptacles so as to effect releasable coupling of the first plurality of pusher members to the pusher and provide the first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position, wherein the first operative plurality of pusher members provides the first spatial arrangement of pusher members relative to the pusher.

19. The PCB test fixture as claimed in claim 15, wherein the plurality of receptacles is configured such that, with respect to a first plurality of pusher members, each one of the first plurality of pusher members is disposed for becoming releasably coupled to a one of the plurality of receptacles in an interference fit relationship such that the first plurality of pusher members is releasably coupled to a first plurality of receptacles so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position;

and wherein the plurality of receptacles is further configured such that, with respect to a second plurality of pusher members, each one of the second plurality of pusher members is disposed for becoming releasably coupled to a one of the plurality of receptacles in an interference fit relationship such that the second plurality of pusher members is releasably coupled to a second plurality of receptacles so as to effect releasable coupling of the second plurality of pusher members to the pusher and thereby provide a second operative plurality of pusher members releasably coupled to the pusher, wherein the second operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position;

and wherein the first plurality of receptacles is different than the second plurality of receptacles.

20. The PCB test fixture as claimed in claim 19, wherein the first operative plurality of pusher members provides a first spatial arrangement of pusher members relative to the pusher;

and wherein the second operative plurality of pusher members provides a second spatial arrangement of pusher members relative to the pusher.

21. The PCB test fixture as claimed in claim 15, wherein the plurality of receptacles is configured such that, with respect to a first plurality of pusher members, each one of the first plurality of pusher members is disposed for becoming releasably coupled to a one of the plurality of receptacles in an interference fit relationship such that the first plurality of pusher members is releasably coupled to a first plurality of receptacles so as to effect releasable coupling of the first plurality of pusher members to the pusher and thereby provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position;

and upon uncoupling of the first operative plurality of pusher members from the pusher after the first operative plurality of pusher members has been releasably coupled to the pusher by virtue of the releasable coupling of each one of the first plurality of pusher member to a one of the plurality of receptacles, the plurality of couplers is configured such that, with respect to a second plurality of pusher members, each one of the second plurality of pusher members is disposed for becoming releasably coupled to a one of the plurality of receptacles in an interference fit relationship such that the second plurality of pusher members is releasably coupled to a second plurality of receptacles so as to effect releasable coupling of the second plurality of pusher members to the pusher and thereby provide a second operative plurality of pusher members releasably coupled to the pusher, wherein the second operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position;

and wherein first plurality of receptacles is different than the second plurality of receptacles.

22. The PCB test fixture as claimed in claim 21, wherein the first operative plurality of pusher members provides a first spatial arrangement of pusher members relative to the pusher;

and wherein the second operative plurality of pusher members provides a second spatial arrangement of pusher members relative to the pusher.

23. The PCB test fixture as claimed in claim 21, wherein, upon uncoupling of the second operative plurality of pusher members from the pusher after the second operative plurality of pusher members has been releasably coupled to the pusher by virtue of the releasable coupling of each one of the second plurality of pusher member to a one of the plurality of receptacles, the plurality of receptacles is configured such that, with respect to the first plurality of pusher members, each one of the first plurality of pusher members is disposed for becoming releasably coupled to a one of the plurality of receptacles such that the first plurality of receptacles is releasably coupled to the first plurality of receptacles so as to effect releasable coupling of the first plurality of pusher members to the pusher and provide a first operative plurality of pusher members releasably coupled to the pusher, wherein the first operative plurality of pusher members is configured for translating, to a PCB which is supported by the PCB support and is disposed in the PCB test position, a force being applied by the pusher so as to effect pressing of a circuit of the PCB against the electrical tester when the PCB is supported on the PCB support and disposed in the PCB test position.

\* \* \* \* \*